(12) United States Patent
Fuderer

(10) Patent No.: US 11,474,170 B2
(45) Date of Patent: Oct. 18, 2022

(54) MRI METHOD FOR $B_0$-MAPPING

(71) Applicant: KONINKLIJKE PHILIPS N.V., Eindhoven (NL)

(72) Inventor: Miha Fuderer, Best (NL)

(73) Assignee: Koninklijke Philips N.V., Eindhoven (NL)

( * ) Notice: Subject to any disclaimer, the term of this patent is extended or adjusted under 35 U.S.C. 154(b) by 0 days.

(21) Appl. No.: 17/256,702

(22) PCT Filed: Jun. 27, 2019

(86) PCT No.: PCT/EP2019/067117
§ 371 (c)(1),
(2) Date: Dec. 29, 2020

(87) PCT Pub. No.: WO2020/007697
PCT Pub. Date: Jan. 9, 2020

(65) Prior Publication Data
US 2021/0255259 A1    Aug. 19, 2021

(30) Foreign Application Priority Data
Jul. 3, 2018 (EP) .................................... 18181333

(51) Int. Cl.
*G01R 33/24* (2006.01)
*G01R 33/44* (2006.01)
*G01R 33/56* (2006.01)

(52) U.S. Cl.
CPC ......... *G01R 33/243* (2013.01); *G01R 33/443* (2013.01); *G01R 33/448* (2013.01); *G01R 33/5608* (2013.01)

(58) Field of Classification Search
CPC .. G01R 33/243; G01R 33/443; G01R 33/448; G01R 33/5608
See application file for complete search history.

(56) References Cited

U.S. PATENT DOCUMENTS 7,202,665 B1    4/2007 Reeder
2014/0327440 A1*    11/2014 Nakanishi .............. A61B 5/055
                                                             324/309
(Continued)

FOREIGN PATENT DOCUMENTS

WO    2016198363 A1    12/2016

OTHER PUBLICATIONS

Junmin Liu et al., "Method for B0 Off-Resonance Mapping by Non-Iterative Correction of Phase-Errors (B0-NICE)" Magnetic Resonance in Medicine 74 p. 1177-1188 (2015).
(Continued)

*Primary Examiner* — Gregory H Curran

(57) ABSTRACT

A $B_0$-mapping method determines the spatial distribution of a static magnetic field in a pre-selected imaging zone comprising computation of the spatial distribution of a static magnetic field from a spatial distribution of spin-phase accruals between magnetic resonance echo signals from the imaging zone and an estimate of the proton density distribution in the imaging zone. The invention provides the field estimate also in cavities and outside tissue. Also the field estimate of the invention suffers less from so-called phase-wraps.

21 Claims, 3 Drawing Sheets

(56) References Cited

U.S. PATENT DOCUMENTS

| | | | |
|---|---|---|---|
| 2015/0002149 A1* | 1/2015 | Nehrke | G01R 33/246 |
| | | | 324/309 |
| 2015/0077115 A1 | 3/2015 | Fautz et al. | |
| 2015/0355298 A1* | 12/2015 | Ben-Eliezer | G01R 33/50 |
| | | | 324/309 |
| 2015/0362578 A1 | 12/2015 | Biber et al. | |
| 2017/0350951 A1 | 12/2017 | Samsonov | |
| 2017/0371010 A1 | 12/2017 | Shanbhag et al. | |
| 2018/0180693 A1 | 6/2018 | Boernert et al. | |
| 2018/0372827 A1* | 12/2018 | Shiodera | A61B 5/7257 |

OTHER PUBLICATIONS

D.N. Splitthoff et al.,"SENSE Shimming (SSH): A Fast Approach for Determining B0 Field Inhomogeneities Using Sensitivity Coding" Magnetic Resonance in Med. 62 p. 1319-1325 (2009).

International Search Report and Written Opinion from PCT/EP2019/067117 dated Oct. 1, 2019.

Timothy J Colgan et al: "Effects of Spatial Resolution on Quantitative Susceptibility Mapping", Proceedings of the International Society for Magnetic Resonance in Medicine, 25th Annual Meeting and Exhibition, Honolulu, HI, USA, Apr. 22-27, 2017, vol. 25, p. 1959, Apr. 7, 2017.

Rares Salomir et al: "A fast calculation method for magnetic field inhomogeneity due to an arbitrary distribution of bulk susceptibility", Concepts in Magnetic Resonance, vol. 19B, No. 1, Jan. 1, 2003 (Jan. 1, 2003), pp. 26-34.

* cited by examiner

MRI METHOD FOR $B_0$-MAPPING

CROSS REFERENCE TO RELATED APPLICATIONS

This application is a U.S. national phase application of International Application No. PCT/EP2019/067117 (published as WO2020007697A1) filed on Jun. 27, 2019, which claims benefit of EP Application Serial No. 18181333.8 (published as EP3591418A1) filed on Jul. 3, 2018 and is incorporated herein by reference.

FIELD OF THE INVENTION

The invention pertains to a $B_0$-mapping method for determining the spatial distribution of a static magnetic field in a pre-selected imaging zone.

Magnetic resonance imaging (MRI) methods utilize the interaction between magnetic fields and nuclear spins in order to form two-dimensional or three-dimensional images are widely used nowadays, notably in the field of medical diagnostics, because for the imaging of soft tissue they are superior to other imaging methods in many respects, do not require ionizing radiation and are usually not invasive.

According to the MRI method in general, the body of the patient to be examined is arranged in a strong, uniform magnetic field $B_0$ whose direction at the same time defines an axis (normally the z-axis) of the co-ordinate system to which the measurement is related. The magnetic field $B_0$ causes different energy levels for the individual nuclear spins in dependence on the magnetic field strength which can be excited (spin resonance) by application of an electromagnetic alternating field (RF field) of defined frequency (so-called Larmor frequency, or MR frequency). From a macroscopic point of view the distribution of the individual nuclear spins produces an overall magnetization which can be deflected out of the state of equilibrium by application of an electromagnetic pulse of appropriate frequency (RF pulse) while the corresponding magnetic field B1 of this RF pulse extends perpendicular to the z-axis, so that the magnetization performs a precession motion about the z-axis. The precession motion describes a surface of a cone whose angle of aperture is referred to as flip angle. The magnitude of the flip angle is dependent on the strength and the duration of the applied electromagnetic pulse. In the example of a so-called 90° pulse, the magnetization is deflected from the z axis to the transverse plane (flip angle 90°).

After termination of the RF pulse, the magnetization relaxes back to the original state of equilibrium, in which the magnetization in the z direction is built up again with a first time constant T1 (spin lattice or longitudinal relaxation time), and the magnetization in the direction perpendicular to the z-direction relaxes with a second and shorter time constant T2 (spin-spin or transverse relaxation time). The transverse magnetization and its variation can be detected by means of receiving RF antennae (coil arrays) which are arranged and oriented within an examination volume of the magnetic resonance examination system in such a manner that the variation of the magnetization is measured in the direction perpendicular to the z-axis. The decay of the transverse magnetization is accompanied by dephasing taking place after RF excitation caused by local magnetic field inhomogeneities facilitating a transition from an ordered state with the same signal phase to a state in which all phase angles are uniformly distributed. The dephasing can be compensated by means of a refocusing RF pulse (for example a 180° pulse). This produces an echo signal (spin echo) in the receiving coils.

In order to realize spatial resolution in the subject being imaged, such as a patient to be examined, constant magnetic field gradients extending along the three main axes are superposed on the uniform magnetic field $B_0$, leading to a linear spatial dependency of the spin resonance frequency. The signal picked up in the receiving antennae (coil arrays) then contains components of different frequencies which can be associated with different locations in the body. The signal data obtained via the receiving coils correspond to the spatial frequency domain of the wave-vectors of the magnetic resonance signal and are called k-space data. The k-space data usually include multiple lines acquired of different phase encoding. Each line is digitized by collecting a number of samples. A set of k-space data is converted to an MR image by means of Fourier transformation.

The transverse magnetization dephases also in presence of constant magnetic field gradients. This process can be reversed, similar to the formation of RF induced (spin) echoes, by appropriate gradient reversal forming a so-called gradient echo. However, in case of a gradient echo, effects of main field inhomogeneities, chemical shift and other off-resonances effects are not refocused, in contrast to the RF refocused (spin) echo. Inhomogeneities of the main magnetic field ($B_0$-inhomogeneities) may be a confounding factor in the spatial encoding of the magnetic resonance signals and accordingly lead to errors in the reconstructed magnetic resonance images. A $B_0$-mapping representing the spatial distribution of the main magnetic field strength in the examination zone of the magnetic resonance examination system may be employed to correct for the induced encoding errors. This correction may be done in reconstruction or the inhomogeneities of the main magnetic field by be compensated for by shimming techniques.

BACKGROUND OF THE INVENTION

A $B_0$-mapping method for determining the spatial distribution of a static magnetic field in a pre-selected imaging zone is known from the US-patent application US2017/0350951. The known $B_0$-mapping method makes use of the phase differences between echo signals of different echo times to estimate the magnetic field distribution in the imaging zone of an MRI system.

SUMMARY OF THE INVENTION

An object of the invention is to provide a more a more accurate $B_0$-mapping method. This object is achieved by the $B_0$-mapping method for determining the spatial distribution of a static magnetic field in a pre-selected imaging zone comprising computation of the spatial distribution of a static magnetic field from a spatial distribution of spin-phase accruals between magnetic resonance echo signals from the imaging zone and an estimate of the proton density distribution in the imaging zone.

The present invention makes use of spatial distribution of spin-phase accruals between magnetic resonance echo signals from the imaging zone as well as the estimate of the proton density distribution. The invention provides the field estimate also in cavities and outside tissue. Also the field estimate of the invention suffers less from so-called phase-wraps. Further, the field map estimated from the present invention is more accurate than results that are based on the spatial distribution of spin-phase accruals only. In fact, where the spin-phase accruals are derived from weak signals, the resulting $B_0$-mapping is often more stable when relying more on the estimate based on the proton density distribution. Calculation of the local magnetic field in the presence of an arbitrary distribution of bulk susceptibility is known per se from the paper '*A fast calculation method for magnetic field inhomogeneity due to an arbitrary distribution of bulk susceptibility*' by R. Salomir et al. in Magnetic Resonance Engineering 19B (2003) 26-34.

These and other aspects of the invention will be further elaborated with reference to the embodiments defined various embodiments below.

A practical implementation of the invention involves, computation of a phase-estimate magnetic susceptibility distribution that is consistent with the spin-phase accrual distribution, computation of a proton-estimate magnetic susceptibility distribution that is consistent the estimated proton spin density distribution, fit a final magnetic susceptibility distribution so as to minimise the differences between the final magnetic susceptibility distribution and both (i) the phase-estimate from the magnetic susceptibility distribution and (ii) from the proton-estimate magnetic susceptibility distribution, and compute the spatial distribution of the static magnetic field from the final magnetic susceptibility distribution.

This implementation provides a practical manner to obtain the final magnetic susceptibility distribution that as best as possible reconciles both consistency with the spin-accrual distribution as well as with the proton density distribution. The present invention is based on the insight to take account of both (i) the spatial distribution of spin-phase accruals and (ii) the proton density distribution. This may be implemented by (i) derive the spin-phase accruals from magnetic resonance signals and (ii) estimate the proton density distribution. Accurate results are obtained by fitting the magnetic susceptibility distribution such that it optimally reconciles with both the spin-phase accrual distribution as well as with the estimated proton density. The invention in particular solves the problem that in regions where the proton density is low, the spin-phase accrual cannot be reliably measured and e.g. has a low signal-to-noise ratio. Accordingly, taking the proton density distribution into account achieves more reliable results because data from the regions with low proton density are more realistically taken into account. In a simple implementation the magnetic susceptibility distribution may be computed from the spin-phase accrual distribution and from the estimated proton density in regions with a high proton density and a low proton density, respectively. In regions between regions of high proton density and low proton density respectively, the magnetic susceptibility distribution may be estimated by simple interpolation between the solution for the magnetic susceptibility distribution that is associated with the spin-phase accrual and with the proton density, respectively. Thus, the determination of the spatial distribution of the static magnetic field taken into account both the spin-phase accrual distribution measured from the acquired magnetic resonance echo signal as well as the estimated proton density.

The determination of the spatial distribution of the static magnetic field takes into account both the spin-phase accrual distribution measured form the acquired magnetic resonance echo signal as well as the estimated proton density.

The spin-phase accrual distributions as well as the estimated proton density are input o the computation that provides the spatial magnetic susceptibility distribution as an intermediate result. From the computed spatial distribution of the magnetic susceptibility, the spatial various of the static magnetic field may be calculated. As set out above, irrespective of the details of exactly how the solution of the magnetic c susceptibility fits with both the measured spin-phase accrual and the estimated proton density, to a more or less extent the resulting spatial distribution of the static magnetic field is less or more sensitive to errors due to regions where there is a low proton density, e.g. regions in which there is air, or regions outside the body of the patient to be examined. The better the solution for the magnetic susceptibility distribution is reconciled with both the spin phase accrual distribution and the proton density distribution, the more accurate and reliable the resulting spatial distribution of the static magnetic field.

In another implementation of the invention, the final magnetic susceptibility distribution is computed in an iterative manner, in which the iteration is between constraints of minimal difference between the final magnetic susceptibility distribution and the magnetic susceptibility distribution consistent with the phase accrual distribution and minimal difference between the final magnetic susceptibility distribution and the magnetic susceptibility distribution consistent with the estimated proton spin density distribution.

This iterative implementation makes efficient use of the information from the phase accrual as well as from the proton density to accurately estimate the magnetic susceptibility that best matches the phase accrual distribution and the proton density distribution. Further, the effect of phase wraps is incorporated in the computation of the final magnetic susceptibility distribution. The iterative approach is well suitable to account for strong non-linearities of the constraints. In more detail, the iterative approach starts from an initial estimate of the magnetic field distribution from which an estimate of the susceptibility distribution is computed. From the computed susceptibility distribution a resulting magnetic field distribution is computed to (i) best fit the computed susceptibility distribution while (ii) taking account of phase wrapping. This process may be further iterated to find the susceptibility distribution and the magnetic field distribution that match self-consistently while accounting for phase wraps. The minimisation of the difference between the magnetic field distribution in the current integration from the susceptibility distribution in the previous integration (and accounting for phase wraps) is scaled with the inaccuracy of the magnetic field distribution. Accurate results are obtained by scaling with the square of the expected inaccuracy of the magnetic field distribution. It appears that the estimate of the magnetic field distribution is consistent with a Gaussian distribution of the error in the estimate.

The estimated proton density distribution may be simplified in that a limited number, typically three, of segments are used to obtain the estimated proton density distribution from diagnostic images, notably from magnetic resonance images. Good results are achieved by segmentation into components representing soft tissue, interstitial voids and air. That is, distinction is made between soft tissue, air in voids inside the body of the patient to be examined and air outside the body.

The $B_0$-mapping method of the invention may be computationally more efficient by initialisation based on an initial estimate of the $B_0$-mapping and optionally also of its accuracy.

The computational effort of the $B_0$-mapping of the invention is reduced by segmenting the estimate proton distribution of a limited number (e.g. three or six) components. Good results are achieved using a segmentation into components representing (i) soft-tissue, (ii) interstitial signal voids (which may be due to air or bone) and (iii) air outside the body of the patient to be examined. In a more sophisticated implementation segmentation components representing different signal-generating materials may be added. These components may represent silicone, metal or ceramics. Note that air or bone in the body have a low proton density and a very short dephasing time, respectively, so that these lead to signal voids within the body.

The invention also relates to a magnetic resonance examination system as defined in accordance with a representative embodiment. This magnetic resonance examination system of the invention achieves is enabled to make use of spatial distribution of spin-phase accruals between magnetic resonance echo signals from the imaging zone as well as the estimate of the proton density distribution. The invention provides the field estimate also in cavities and outside tissue. The invention further relates to a computer programme as defined in accordance with a representative embodiment. The computer programme of the invention can be provided on a data carrier such as a CD-rom disk or a USB memory stick, or the computer programme of the invention can be downloaded from a data network such as the world-wide web. When installed in the computer included in a magnetic resonance imaging system the magnetic resonance imaging system is enabled to operate according to the invention and achieves to enable the magnetic resonance examination system to make use of spatial distribution of spin-phase accruals between magnetic resonance echo signals from the imaging zone as well as the estimate of the proton density distribution. The invention provides the field estimate also in cavities and outside tissue.

These and other aspects of the invention will be elucidated with reference to the embodiments described hereinafter and with reference to the accompanying drawing wherein

DETAILED DESCRIPTION OF THE EMBODIMENTS

Figure 1:
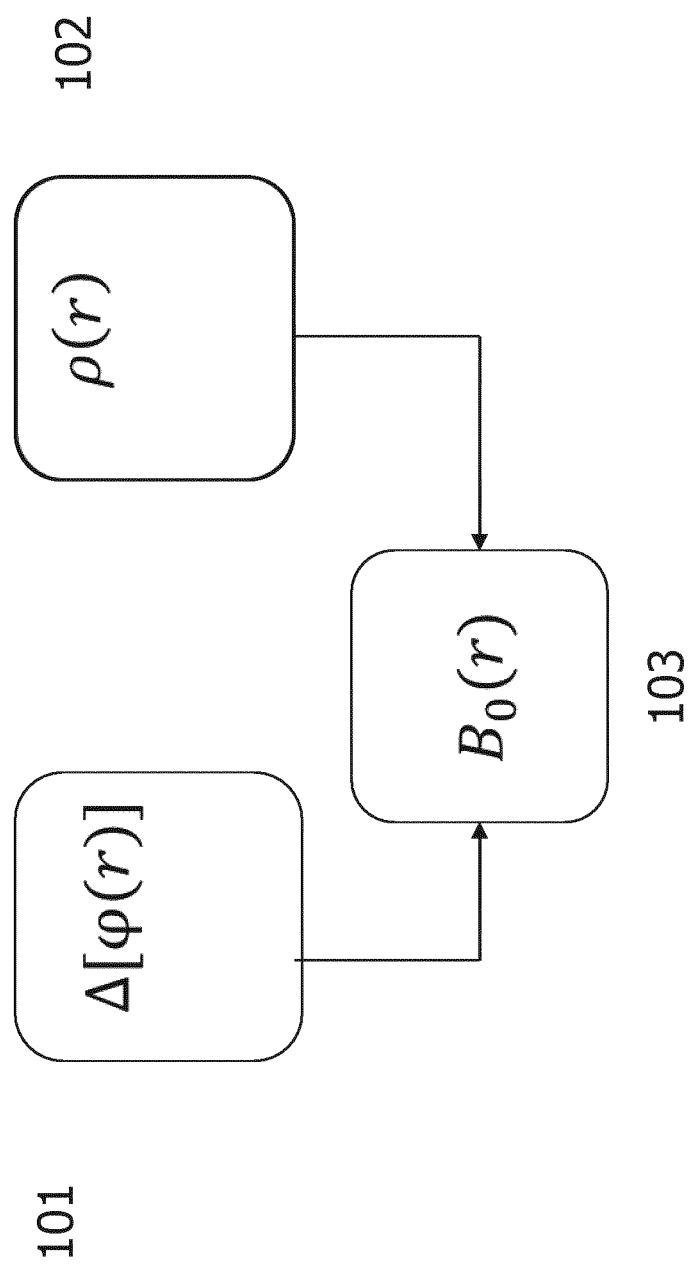
FIG. 1 shows a schematic representation of an implementation of a computation of the spatial distribution of a static magnetic field according to the invention.

FIG. 1 shows a schematic representation of an implementation of a computation of the spatial distribution of a static magnetic field according to the invention. According to this implementation an spatial distribution of spin-phase accruals 101 between magnetic resonance echo signals from the imaging zone is computed from acquired magnetic resonance signals and applied as input to computation 103 of the spatial distribution of a static magnetic field. Also an estimate of the proton density distribution in the imaging zone as accessed 102 and input to an estimate of the proton density distribution in the imaging zone. The proton density distribution may be estimated from magnetic resonance signals acquired during a preparation phase, e.g. collaterally obtained from measurement of spatial coil sensitivity profiles of the magnetic resonance examination system's radio frequency receiver coils.

Figure 2:
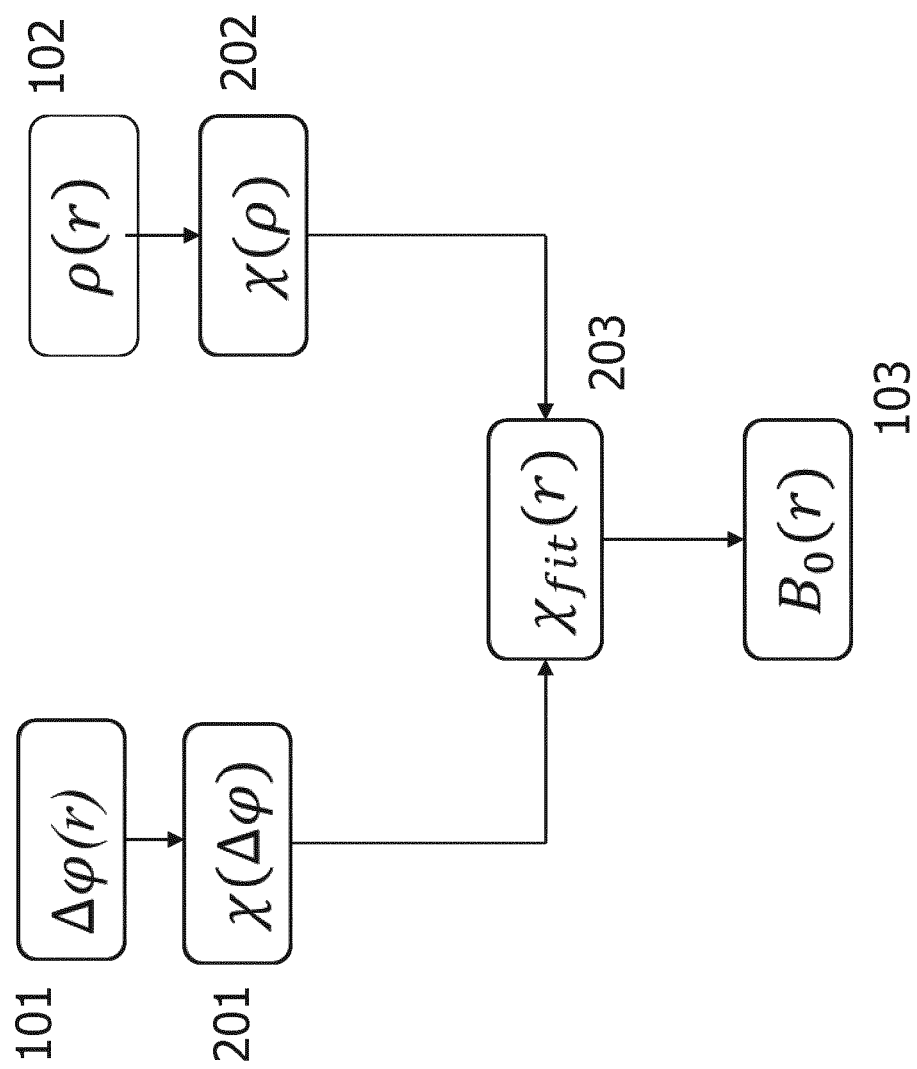
FIG. 2 shows a more detailed schematic representation of an implementation of a computation of the spatial distribution of a static magnetic field according to the invention and FIG. 3 shows a diagrammatic representation of an magnetic resonance examination system in which the invention is incorporated.

FIG. 2 shows a more detailed schematic representation of an implementation of a computation of the spatial distribution of a static magnetic field according to the invention. From the spin-phase accruals 101, an initial magnetic susceptibility distribution 201 is estimated that is consistent with the spin phase accruals. From the proton density distribution another initial magnetic susceptibility distribution is estimated 202 that is consistent with the proton density distribution. Then, an iterative approach 203 is applied to fit a magnetic susceptibility distribution that optimally reconciles consistency with both the spin phase accrual distribution and the proton density distribution. From the ultimate fitted magnetic susceptibility distribution, the spatial magnet field distribution computation 103.

The input to the envisaged processing is:

An initial version of a $B_0$-map (actually: its deviation from a perfectly homogenous field), $B_m(x)$ 'm' stands for "measured". The vector x is 3-dimensional.

A rough location-dependent knowledge of the inaccuracy of the above, expressed as $\sigma_B(x)$.

An estimate of proton-density of the object, $\rho(x)$.

Yet, that proton-density map is not of direct use, but it requires some type of pre-processing that can segment the volume e.g. into three categories: "soft", "interstitial" and "air".

The output is an improved estimate of the error field, denoted as $\tilde{B}(x)$.

An important intermediate result is defined as $\tilde{\chi}(x)$ denoted as "an improved estimate of the local magnetic susceptibility" (although the word 'improved' is somewhat misplaced, since there is no 'initial' estimate here).

The envisaged processing estimates the intermediate $\tilde{\chi}(x)$, by $$\tilde{\chi}(x) = \min_{\chi}\left[\frac{\left\|B_0 \mathcal{F}\left\{\left[\frac{1}{3} - \frac{k_{z,p}^2}{k_{x,p}^2 + k_{y,p}^2 + k_{z,p}^2}\right]\mathcal{F}^{-1}(\tilde{\chi}(x))\right\} - B_m(x) - nB_{warp}\right\|^2}{\sigma_B^2(x)}\right]$$

Subject to setting of the value of $\tilde{\chi}(x)$ in selected ranges in volumes of which the material content is a priori known. Good results are achieved when setting:

$-9 \cdot 10^{-6} < \tilde{\chi}(x) < -7 \cdot 10^{-6}$ for soft tissue $-9 \cdot 10^{-6} < \tilde{\chi}(x) < 0$ for interstitial $\tilde{\chi}(x) = 0$ for air.

In these equations, $B_0$ is the value of the main field strength

In e.g. $k_{x,p}$, the 'p' stands for "physical", i.e. in units of 1/length (e.g. 1/m or 1/mm).

$\mathcal{F}$ indicates the Fourier transform.

n is any integer.

$B_{warp}$ corresponds to $$\frac{1}{\Delta TE}$$

(assuming that $B_m(x)$ has been established by examining phase difference between two echoes).

In principle, there is a one-to-one correspondence between $\tilde{B}(x)$ and $\tilde{\chi}(x)$:

$$\tilde{B}(i;\chi) = B_0 \mathcal{F}\left[\left(\frac{1}{3} - \frac{k_{z,p}^2}{k_{x,p}^2 + k_{y,p}^2 + k_{z,p}^2}\right) \mathcal{F}^{-1}(\tilde{\chi}(x))\right]$$

So far for the processing.

All of this could be seen as an advanced way of filtering $B_m(x)$ into $\tilde{B}(x)$.

The central element of the processing, the $$"\mathcal{F}\left[\left(\frac{1}{3} - \frac{k_{z,p}^2}{k_{x,p}^2 + k_{y,p}^2 + k_{z,p}^2}\right) \mathcal{F}^{-1}(\tilde{\chi}(x))\right]"$$

can be reasonably approximated by a multi-resolution decomposition of $\tilde{\chi}(x)$, combined with a local (small-kernel-)convolution on each of the levels.

Alternatively:

$$\tilde{\chi}(x) = \min_{\chi}\left[\frac{\|\tilde{B}(x;\chi) - B_m(x) - nB_{warp}\|^2}{\sigma_{\tilde{B}}^2(x)}\right],$$

while for example
$-9 \cdot 10^{-6} < \tilde{\chi}(x) < -7 \cdot 10^{-6}$ for soft tissue, $-9 \cdot 10^{-6} < \tilde{\chi}(x) < 0$ for interstitial, and $\tilde{\chi}(x) = 0$ for air. The magnetic field consistent with the susceptibility distribution is denoted as $\tilde{B}(x; \chi)$, while the information on the protons density is taken into account in the set value ranges for the susceptibility in the segmented areas. In other words, given the set values ranges for the susceptibility values, the susceptibility is matched to produces the magnetic field distribution n that fits the measured magnetic field distribution.

Figure 3:
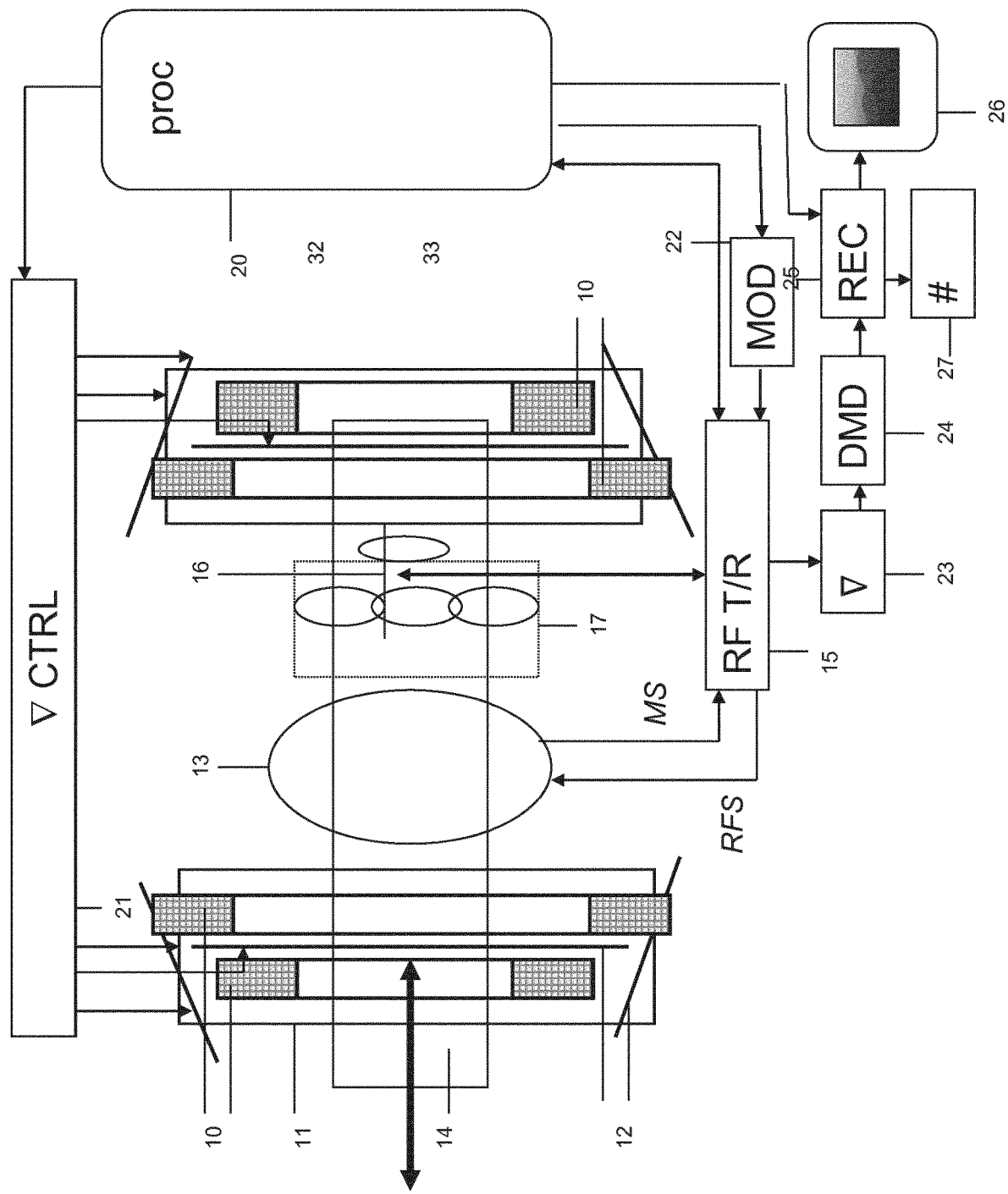

FIG. 3 shows diagrammatically a magnetic resonance imaging system in which the invention is used. The magnetic resonance imaging system includes a set of main coils 10 whereby the steady, uniform magnetic field is generated. The main coils are constructed, for example in such a manner that they enclose a tunnel-shaped examination space. The patient to be examined is placed on a patient carrier which is slid into this tunnel-shaped examination space. The magnetic resonance imaging system also includes a number of gradient coils 11, 12 whereby magnetic fields exhibiting spatial variations, notably in the form of temporary gradients in individual directions, are generated so as to be superposed on the uniform magnetic field. The gradient coils 11, 12 are connected to a gradient control 21 which includes one or more gradient amplifier and a controllable power supply unit. The gradient coils 11, 12 are energised by application of an electric current by means of the power supply unit of the gradient control 21; to this end the power supply unit is fitted with electronic gradient amplification circuit that applies the electric current to the gradient coils so as to generate gradient pulses (also termed 'gradient waveforms') of appropriate temporal shape The strength, direction and duration of the gradients are controlled by control of the power supply unit. The magnetic resonance imaging system also includes transmission and receiving coils 13, 16 for generating the RF excitation pulses and for picking up the magnetic resonance signals, respectively. The transmission coil 13 is preferably constructed as a body coil in which the object to be examined can be enclosed. The body coil is usually arranged in the magnetic resonance imaging system in such a manner that the patient 30 to be examined is enclosed by the body coil when he or she is arranged in the magnetic resonance imaging system. The body coil acts as a transmission antenna for the transmission of the RF excitation pulses and RF refocusing pulses. Preferably, the body coil involves a spatially uniform intensity distribution of the transmitted RF pulses (RFS). The same coil or antenna is usually used alternately as the transmission coil and the receiving coil. Furthermore, the transmission and receiving coil is usually shaped as a coil, but other geometries where the transmission and receiving coil acts as a transmission and receiving antenna for RF electromagnetic signals are also feasible. The transmission and receiving coils 13, 16 are connected to an electronic transmission and receiving circuit 15.

It is to be noted that it is alternatively possible to use separate transmission and/or receiving coils 13, 16. For example, receiving coils 16, may be surface coils and can be used as receiving and/or transmission coils. Such surface coils have a high sensitivity in a comparatively small volume. The receiving coils, such as the surface coils, are connected to a demodulator 24 and the received magnetic resonance signals (MS) are demodulated by means of the demodulator 24. The demodulated magnetic resonance signals (DMS) are applied to a reconstruction unit. The receiving coil is connected to a preamplifier 23. The preamplifier 23 amplifies the RF resonance signal (MS) received by the receiving coil 16 and the amplified RF resonance signal is applied to a demodulator 24. The demodulator 24 demodulates the amplified RF resonance signal. The demodulated resonance signal contains the actual information concerning the local spin densities in the part of the object to be imaged. Furthermore, the transmission and receiving circuit 15 is connected to a modulator 22. The modulator 22 and the transmission and receiving circuit 15 activate the transmission coil 13 so as to transmit the RF excitation and refocusing pulses. In particular the surface receive coils are coupled to the transmission and receive circuit by way of a wireless link. Magnetic resonance signal data received by the receiving coils 16, which again may be surface coils, are transmitted to the transmission and receiving circuit 15 and control signals (e.g. to tune and detune the surface coils) are sent to the surface coils over the wireless link.

The reconstruction unit derives one or more image signals from the demodulated magnetic resonance signals (DMS), which image signals represent the image information of the imaged part of the object to be examined. The reconstruction unit 25 in practice is constructed preferably as a digital image processing unit, which is programmed so as to derive from the demodulated magnetic resonance signals the image signals which represent the image information of the part of the object to be imaged. The signal on the output of the reconstruction monitor 26, so that the monitor can display the magnetic resonance image. It is alternatively possible to store the signal from the reconstruction unit 25 in a buffer unit 27 while awaiting further processing.

The magnetic resonance imaging system according to the invention is also provided with a control unit 20, for example in the form of a computer which includes a (micro) processor. The control unit 20 controls the execution of the RF excitations and the application of the temporary gradient fields. To this end, the computer program according to the invention is loaded, for example, into the control unit 20 and the reconstruction unit 25. The $B_0$-mapping may be computed by the processor of the control unit and then used in the reconstruction unit 25 to correct the reconstructed magnetic resonance image for encoding errors due to the $B_0$-inhomogeneities. Also, or alternatively, the $B_0$-mapping may be applied to the gradient control unit to control the gradient coils for active shimming to compensate for the $B_0$-inhomogeneities. The $B_0$-mapping may be applied as well to specially designed shim coils (not shown) to compensate for the $B_0$-inhomogeneities.

The invention claimed is:

1. A $B_0$-mapping method for determining spatial distribution of a static magnetic field in a pre-selected imaging zone, the method comprising:
   computing the spatial distribution of a static magnetic field from a spatial distribution of spin-phase accruals between magnetic resonance echo signals from the imaging zone; and
   estimating a proton density distribution in the imaging zone by segmenting at least three components, wherein the segmenting involves at least components representing soft-tissue, interstitial voids and air.

2. The $B_0$-mapping method of claim 1, further comprising:
   computing a phase-estimate magnetic susceptibility distribution that is consistent with a spin-phase accrual distribution;
   computing a proton-estimate magnetic susceptibility distribution that is consistent with an estimated proton spin density distribution;
   fitting a final magnetic susceptibility distribution to minimize differences both: (i) between the final magnetic susceptibility distribution and the phase-estimate magnetic susceptibility distribution; and (ii) between the final magnetic susceptibility distribution and the proton-estimate magnetic susceptibility distribution; and
   computing a spatial distribution of a static magnetic field from the final magnetic susceptibility distribution.

3. The $B_0$-mapping method of claim 2, wherein
   the computing of the final magnetic susceptibility distribution is done in an iterative procedure, and the iteration is done between constraints of:
   a minimal difference between the final magnetic susceptibility distribution and the phase-estimate magnetic susceptibly distribution; and
   a minimal difference between the final magnetic susceptibility distribution and the proton-estimate magnetic susceptibility distribution.

4. The $B_0$-mapping method of claim 1, wherein the segmenting includes components representing silicone, metal and ceramic.

5. The $B_0$-mapping method as claimed in claim 3, further comprising initializing the iterative procedure from an initial estimate of the spatial distribution of the static magnetic field and an accuracy of the spatial distribution of the static magnetic field.

6. The $B_0$-mapping method of claim 3, wherein a self-consistent minimization procedure minimizes differences both: (i) between the final magnetic susceptibility distribution and the phase-estimate magnetic susceptibility distribution; and (ii) between the final magnetic susceptibility distribution and the proton-estimate magnetic susceptibility distribution.

7. A magnetic resonance examination system, comprising:
   a processor;
   a tangible, non-transitory computer readable medium that stores instructions, which when executed by the processor, causes the processor to determine spatial distribution of a static magnetic field in a pre-selected imaging zone by:
   computing the spatial distribution of a static magnetic field from a spatial distribution of spin-phase accruals between magnetic resonance echo signals from the imaging zone; and
   estimating a proton density distribution in the imaging zone by segmenting at least three components, wherein the segmenting involves at least components representing soft-tissue, interstitial voids and air.

8. The magnetic resonance examination system of claim 7, wherein the instructions further cause the processor to determine spatial distribution of a static magnetic field in a pre-selected imaging zone by:
   computing a phase-estimate magnetic susceptibility distribution that is consistent with a spin-phase accrual distribution;
   computing a proton-estimate magnetic susceptibility distribution that is consistent with an estimated proton spin density distribution,
   fitting a final magnetic susceptibility distribution to minimize differences both: (i) between the final magnetic susceptibility distribution and the phase-estimate magnetic susceptibility distribution; and (ii) between the final magnetic susceptibility distribution and the proton-estimate magnetic susceptibility distribution; and
   computing a spatial distribution of a static magnetic field from the final magnetic susceptibility distribution.

9. The magnetic resonance examination system of claim 8, wherein the computing of the final magnetic susceptibility distribution is done in an iterative procedure, and the iteration is done between constraints of:
   a minimal difference between the final magnetic susceptibility distribution and the phase-estimate magnetic susceptibly distribution; and
   a minimal difference between the final magnetic susceptibility distribution and the proton-estimate magnetic susceptibility distribution.

10. The magnetic resonance examination system of claim 7, wherein the segmenting includes components representing silicone, metal and ceramic.

11. The magnetic resonance examination system of claim 9, wherein the instructions further cause the processor to determine spatial distribution of a static magnetic field in a pre-selected imaging zone by:
    initializing the iterative procedure from an initial estimate of the spatial distribution of the static magnetic field and an accuracy of the spatial distribution of the static magnetic field.

12. A $B_0$-mapping method for determining spatial distribution of a static magnetic field in a pre-selected imaging zone, the method comprising:
    computing the spatial distribution of a static magnetic field from a spatial distribution of spin-phase accruals between magnetic resonance echo signals from the imaging zone;
    estimating a proton density distribution in the imaging zone;
    computing a phase-estimate magnetic susceptibility distribution that is consistent with a spin-phase accrual distribution;
    computing a proton-estimate magnetic susceptibility distribution that is consistent with an estimated proton spin density distribution;
    fitting a final magnetic susceptibility distribution to minimize differences both: (i) between the final magnetic susceptibility distribution and the phase-estimate magnetic susceptibility distribution; and (ii) between the final magnetic susceptibility distribution and the proton-estimate magnetic susceptibility distribution; and computing a spatial distribution of a static magnetic field from the final magnetic susceptibility distribution.

13. The $B_0$-mapping method of claim 12, wherein the computing of the final magnetic susceptibility distribution is done in an iterative procedure, and the iteration is done between constraints of:

a minimal difference between the final magnetic susceptibility distribution and the phase-estimate magnetic susceptibly distribution; and a minimal difference between the final magnetic susceptibility distribution and the proton-estimate magnetic susceptibility distribution.

14. The $B_0$-mapping method of claim 12, wherein the estimating the proton density distribution comprises segmenting at most components representing soft-tissue, interstitial voids and air.

15. The $B_0$-mapping method as claimed in claim 13, further comprising initializing the iterative procedure from an initial estimate of the spatial distribution of the static magnetic field and an accuracy of the spatial distribution of the static magnetic field.

16. The $B_0$-mapping method of claim 13, wherein a self-consistent minimization procedure minimizes differences both: (i) between the final magnetic susceptibility distribution and the phase-estimate magnetic susceptibility distribution; and (ii) between the final magnetic susceptibility distribution and the proton-estimate magnetic susceptibility distribution.

17. A magnetic resonance examination system, comprising:

a processor;

a tangible, non-transitory computer readable medium that stores instructions, which when executed by the processor, causes the processor to determine spatial distribution of a static magnetic field in a pre-selected imaging zone by:

computing the spatial distribution of a static magnetic field from a spatial distribution of spin-phase accruals between magnetic resonance echo signals from the imaging zone;

estimating a proton density distribution in the imaging zone;

computing a phase-estimate magnetic susceptibility distribution that is consistent with a spin-phase accrual distribution;

computing a proton-estimate magnetic susceptibility distribution that is consistent with an estimated proton spin density distribution;

fitting a final magnetic susceptibility distribution to minimize differences both: (i) between the final magnetic susceptibility distribution and the phase-estimate magnetic susceptibility distribution; and (ii) between the final magnetic susceptibility distribution and the proton-estimate magnetic susceptibility distribution; and computing a spatial distribution of a static magnetic field from the final magnetic susceptibility distribution.

18. The magnetic resonance examination system of claim 17, wherein the computing of the final magnetic susceptibility distribution is done in an iterative procedure, and the iteration is done between constraints of:

a minimal difference between the final magnetic susceptibility distribution and the phase-estimate magnetic susceptibly distribution; and a minimal difference between the final magnetic susceptibility distribution and the proton-estimate magnetic susceptibility distribution.

19. The magnetic resonance examination system of claim 17, wherein the estimating the proton density distribution comprises segmenting at most components representing soft-tissue, interstitial voids and air.

20. The magnetic resonance examination system of claim 18, wherein the instructions further cause the processor to initialize the iterative procedure from an initial estimate of the spatial distribution of the static magnetic field and an accuracy of the spatial distribution of the static magnetic field.

21. The magnetic resonance examination system of claim 18, wherein a self-consistent minimization procedure minimizes differences both: (i) between the final magnetic susceptibility distribution and the phase-estimate magnetic susceptibility distribution; and (ii) between the final magnetic susceptibility distribution and the proton-estimate magnetic susceptibility distribution.

* * * * *